(12) United States Patent
Yoshida

(10) Patent No.: US 6,483,175 B2
(45) Date of Patent: Nov. 19, 2002

(54) WIRING BOARD AND SEMICONDUCTOR DEVICE USING THE SAME

(75) Inventor: Takayuki Yoshida, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/953,270

(22) Filed: Sep. 17, 2001

(65) Prior Publication Data
US 2002/0117739 A1 Aug. 29, 2002

(30) Foreign Application Priority Data
Feb. 26, 2001 (JP) ........................................ 2001-049742

(51) Int. Cl.[7] .......................... H01L 23/62; H01L 23/34; H01L 23/48; H01L 23/52; H01L 23/495; H01L 29/40

(52) U.S. Cl. ........................ 257/665; 257/728; 257/692; 257/695; 257/668; 257/784

(58) Field of Search .................. 257/664, 665, 257/666, 690, 692, 693, 694, 695, 734, 784, 691, 668, 700, 701, 758, 724, 728

(56) References Cited

U.S. PATENT DOCUMENTS 5,387,888 A * 2/1995 Eda et al.

\* cited by examiner

Primary Examiner—Nathan J. Flynn
Assistant Examiner—Victor A. Mandala, Jr.
(74) Attorney, Agent, or Firm—Nixon Peabody LLP; Donald R. Studebaker

(57) ABSTRACT

A wiring board according to the present invention has a substrate, a plurality of lines provided on the substrate, an interference-preventive conductor layer provided between the lines to have open ends and prevent signal interference between the lines, and a via electrically connected to the interference-preventive conductor layer. The via is provided at a point at which a distance from each of the open ends of the interference-preventive conductor layer is less than one quarter of a wavelength corresponding to a maximum frequency component of harmonic components contained in the signal.

4 Claims, 5 Drawing Sheets

WIRING BOARD AND SEMICONDUCTOR DEVICE USING THE SAME

BACKGROUND OF THE INVENTION

The present invention relates to a wiring board in which a semiconductor chip having a semiconductor element for performing a high-speed transmission is mounted or embedded and to a semiconductor device using the wiring board.

As recent electronic equipment has become smaller in size and higher in performance, there have been trends toward higher operating speed and further modulization. As a package for a semiconductor device responsive to the trends, a BGA (Ball-Grid-Array) semiconductor device which is a package of surface-mounting type having ball bumps arranged in rows and columns on the bottom surface thereof has been developed.

Referring to the drawings, an example of a conventional BGA semiconductor device provided for high-speed transmission will be described.

FIG. 4 shows a plan structure of the conventional BGA semiconductor device. As shown in the drawing, a prior art BGA semiconductor device 100 has: a substrate 101 composed of a multilayer structure of an insulating film made of an epoxy resin or the like and a wiring layer made of a conductor material; a plurality of signal lines 102 formed in mutually spaced relationship in an upper surface of the substrate 101 to extend in parallel from the center portion of the substrate 101 to the side edge portions thereof; interline ground layers 103 each formed in the region of the upper surface of the substrate 101 located between the adjacent signal lines 102 to prevent crosstalk therebetween; and a semiconductor chip 104 bonded to the center portion of the substrate 101 by using a soldering material or the like.

The semiconductor chip 104 is electrically connected to each of the signal lines 102 via wires 105. Each of the signal lines 102 and a ground layer (not shown) constitute a microstrip line, while each of back-surface lines (not shown) and an internal power-source layer constitute a microstrip line. Each of the microstrip lines has a specified characteristic impedance $Z_0$.

The signal lines 102 are electrically connected to the respective back-surface lines and to ball bumps (not shown) through vias 106. The interline ground layers 103 are also electrically connected to the ground layer through the vias 106. The semiconductor chip 104 and the respective end portions of the signal lines 102 and the interline ground layers 103 closer to the semiconductor chip 104 are contained in a mold area 107 of the substrate 101.

As the number of the external output terminals of the semiconductor chip 104 increases in the prior art BGA semiconductor device 100, the density of the lines on the substrate 101 also increases to increase the electromagnetic interference between the signal lines 102, so that the influence of crosstalk is no more negligible. To prevent the crosstalk, conductor layers such as the interline ground layers 103 are provided between the adjacent signal lines 102.

In the conventional semiconductor device 100, however, one end or both ends of each of the interline ground layers 103 are open. If one end of each of the interline ground layers 103 is open, the interline ground layer 103 functions as an open stub in the presence of a flowing RF wave.

If a plurality of semiconductor elements on the semiconductor chip 104 switch simultaneously, simultaneous switching noise also termed ground bounce occurs in the internal power-source layer and internal ground layer so that the respective potentials of the power source layer and the ground layer fluctuate significantly.

FIG. 5 shows respective equivalent circuits of the signal line 102 and the interline ground layer 103. When a square-wave signal containing a large number of harmonic components propagates along the signal line 102, the square-wave signal is induced by the interline ground layer 103 so that ground bounce occurs in response in the interline ground layer 103. At this time, a short-circuited state arises at a frequency at which the line length of the open stub of the interline ground layer 103 for crosstalk prevention is equal to one quarter of an effective wavelength so that a specified frequency component is totally reflected in opposite phase by the open end of the interline ground layer 103 having one open end. As a result, the interline ground layer 103 provided intentionally for cross talk prevention causes crosstalk between the square-wave signal propagating along the signal line 102 and the reflected component, which greatly disturbs the square-wave signal.

In addition, the potential of the internal ground layer or the like undergoes larger fluctuations, which may induce a misoperation in the semiconductor device and in a system incorporating the semiconductor device.

SUMMARY OF THE INVENTION

In view of the foregoing conventional problems, it is therefore an object of the present invention to suppress transmission distortion occurring between lines in a wiring board in which a semiconductor device having a semiconductor element for performing high-speed transmission is mounted or embedded.

To attain the object, the present invention fixes an interference-preventive conductor layer for crosstalk prevention provided between the signal lines to a specified potential at a point at a distance of one quarter or less of the effective wavelength of a timing (synchronous) signal for signal transmission from an open end of the interference-preventive conductor layer.

Specifically, a wiring board according to the present invention comprises: a substrate; a plurality of lines provided on the substrate; an interference-preventive conductor layer provided between the lines to have open ends and prevent signal interference between the lines; and potential fixing means electrically connected to the interference-preventive conductor layer, the potential fixing means being provided at a point at which a distance from each of the open ends of the interference-preventive conductor layer is less than one quarter of a wavelength corresponding to a maximum frequency component of harmonic components contained in the signal.

In the wiring board according to the present invention, the potential fixing means for fixing, to the specified value, the potential of the interference-preventive layer for preventing interference between signals on the lines is provided at a point at which a distance from each of the open ends of the interference-preventive conductor layer is less than one quarter of the wavelength corresponding to the maximum frequency component of harmonics contained in the signal. This prevents the frequency component of the timing signal from being totally reflected in opposite phase from each of the open ends of the interference-preventive conductor layer. This prevents significant fluctuations in a square timing signal such as a clock signal propagating along the line, which are due to the crosstalk of the reflected component from the interference-preventive conductor layer to the timing signal. Consequently, transmission distortion arising between the lines is suppressed.

In the wiring board of the present invention, the substrate is preferably composed of a multilayer structure of a plurality of wiring layers and an insulating film formed between the plurality of wiring layers and the potential fixing means is preferably connected to at least one of the plurality of wiring layers.

A semiconductor device according to the present invention comprises: a substrate; a plurality of lines provided on the substrate; a semiconductor chip held on the substrate, the semiconductor chip having a semiconductor element electrically connected to the plurality of lines; an interference-preventive conductor layer provided between the lines to have open ends and prevent signal interference between the lines; and potential fixing means electrically connected to the interference-preventive conductor layer, the potential fixing means being provided at a point at which a distance from each of the open ends of the interference-preventive conductor layer is less than one quarter of a wavelength corresponding to a maximum frequency component of harmonic components contained in the signal.

Since the semiconductor device according to the present invention uses, as a wiring board, the wiring board according to the present invention, a square timing signal propagating along the line is prevented from being greatly disturbed by the crosstalk of the reflected component on the timing signal. This suppresses transmission distortion occurring between the lines and improves the reliability of the semiconductor device.

In the semiconductor device of the present invention, the substrate is preferably composed of a multilayer structure of a plurality of wiring layers and an insulating film formed between the plurality of wiring layers and the potential fixing means is preferably a via connected to at least one of the plurality of wiring layers.

BRIEF DESCRIPTION OF THE DRAWINGS

FIG. 1 illustrate the concept of the present invention, of which

DETAILED DESCRIPTION OF THE INVENTION

A description will be given first to the reflection characteristic of a signal at an open end of a conductor line when an RF signal is propagated by the conductor line.

Figure 1A:
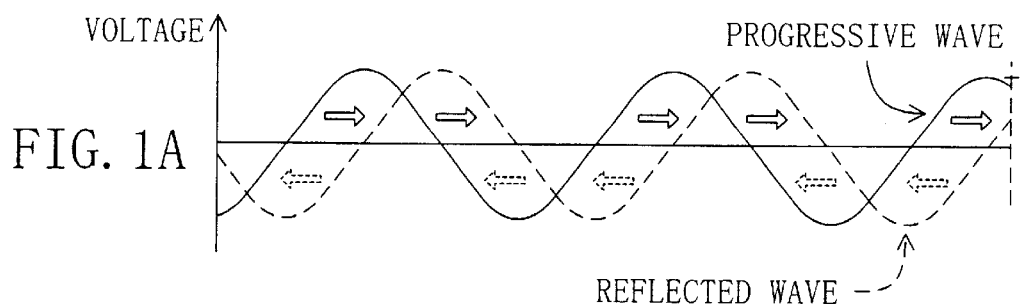
FIG. 1A is a graph showing a progressive wave and a reflected wave on a transmission path having an open end.
Figure 1B:
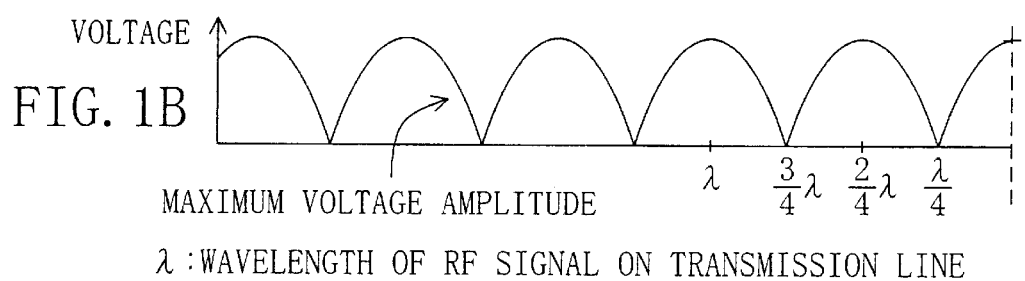
FIG. 1B is a graph showing a standing wave obtained by combining the progressive wave with the reflected wave.

FIGS. 1A and 1B show a progressive wave and a reflected wave as voltages when the RF signal is propagated by the conductor line having the open end (the right end portion of the drawing).

Figure 1C:
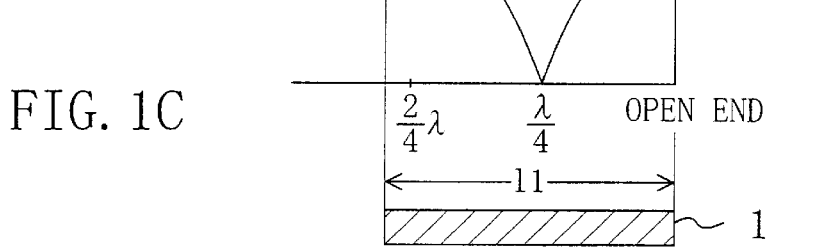
FIGS. 1C and 1D show the relationship between the standing wave and a line length.
Figure 5:
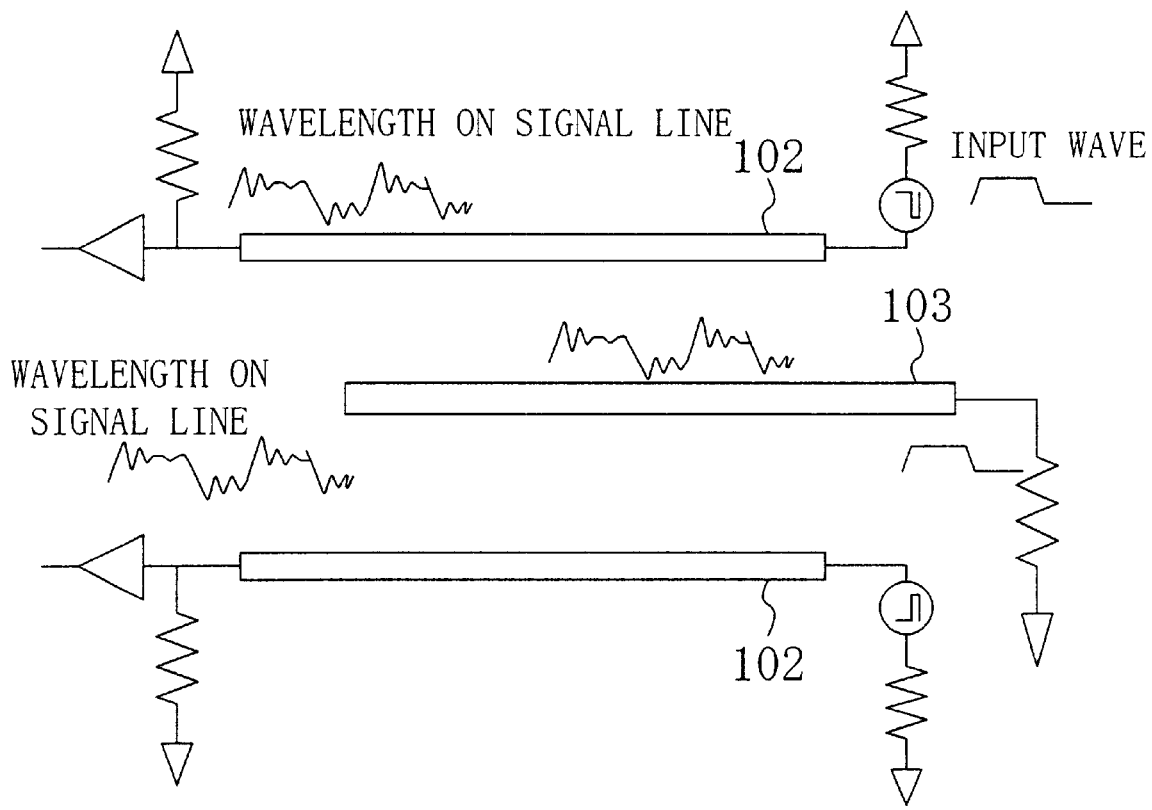
FIG. 5 is an equivalent circuit diagram of a signal line including an interline ground layer for crosstalk prevention in the conventional BGA semiconductor device.

As shown in FIG. 1B, the transmission line has points (nodes) at which the amplitude of voltage is constantly zero and points (antinodes) at which the amplitude of voltage is maximum. Each of the nodes is produced at a point of the transmission line at a distance of an odd-numbered multiple of one quarter wavelength from the open end, while each of the antinodes is produced at a point of the transmission line at a distance of an even-numbered multiple of one quarter wavelength from the open end. In the case of using the transmission line 1, the line length 11 thereof is over $\lambda/4$ as shown in FIG. 1C so that a reflected wave in phase opposite to that of the progressive wave is generated. If the line length is $\lambda/4$, in particular, total reflection occurs. If a square wave is transmitted by the transmission line 1 having a line length equal to or larger than $\lambda/4$, therefore, a ringing waveform as shown in FIG. 5 is produced.

Figure 1D:
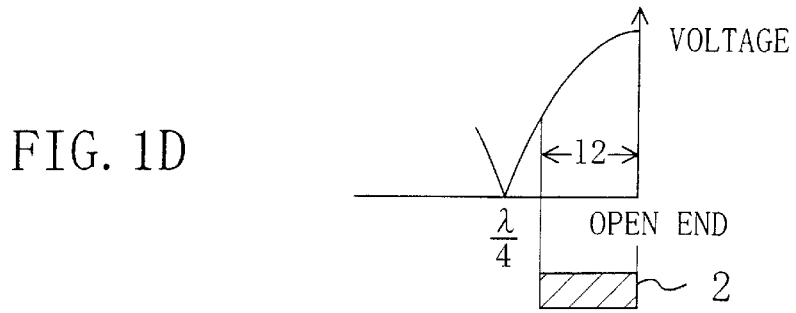

In the case of using the transmission line 2 having a line length 12 shorter than $\lambda/4$ as shown in FIG. 1D, a reflected wave in opposite phase exists but a node at which total reflection occurs is not contained in the transmission line 2. As a result, ringing which occurs when the square wave is transmitted is suppressed in a signal waveform on the transmission line 2.

A description will be given to an embodiment of the present invention with reference to the drawings.

Figure 2A:
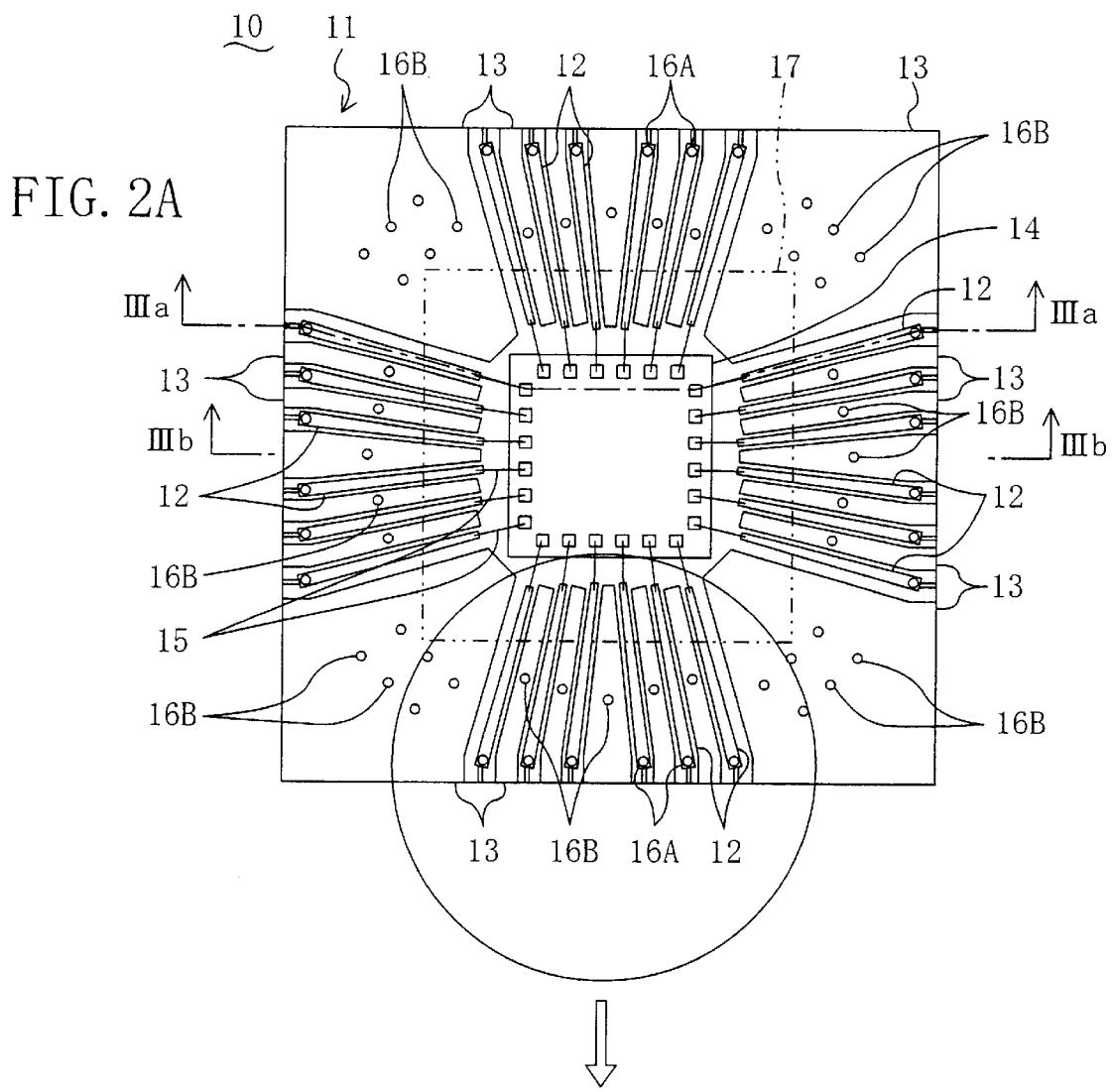
FIG. 2A is a plan view of. a wiring board according to an embodiment of the present invention and a semiconductor device using the wiring board

FIG. 2A shows a plan structure of a wiring board according to the embodiment and to a BGA semiconductor device using the wiring board.

As shown in FIG. 2A, the BGA semiconductor device 10 according to the present embodiment has: a substrate 11 composed of a multilayer structure of an insulating film made of an epoxy resin or a ceramic material and a wiring layer made of a conductor material; a plurality of surface layer lines 12 formed in mutually spaced relationship in an upper surface of the substrate 11 to extend in parallel from the center portion of the substrate 11 to the side edge portions thereof; interline ground layers 13 each formed in the region of the upper surface of the substrate 11 located between the surface layer lines 12 to serve as an interference-preventive conductor layer for preventing crosstalk between the surface layer lines 12; and a semiconductor chip 14 having a digital circuit for performing high-speed data transmission and bonded to the center portion of the substrate 11 by using a soldering material or the like. The semiconductor chip 14 is electrically connected to each of the surface layer lines 12 via a wire.

Figure 3A:
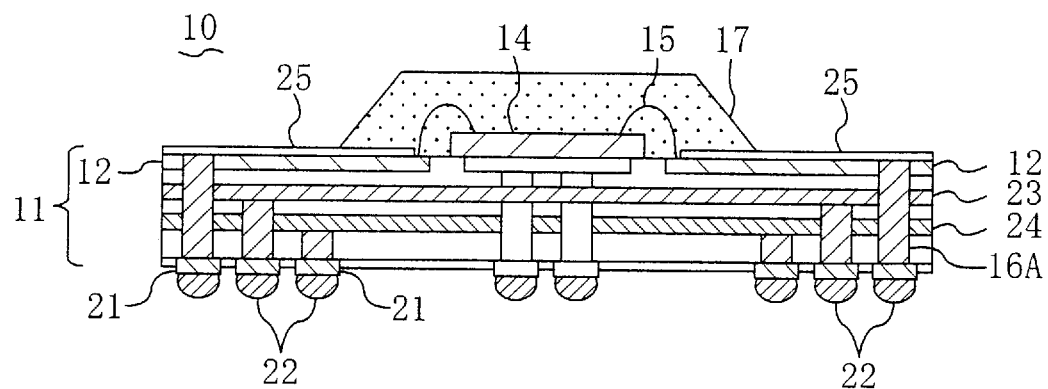
FIG. 3A is a cross-sectional view taken along the line IIIa—IIIa of FIG. 2A.
Figure 3B:
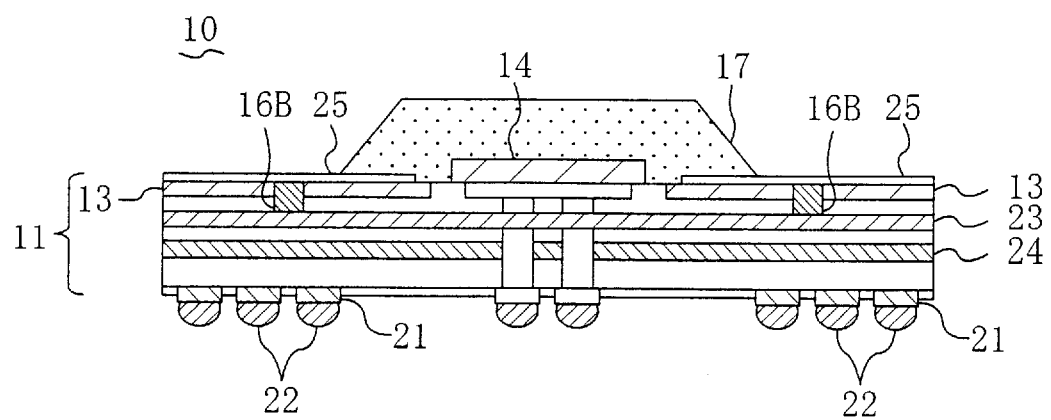
FIG. 3B is a cross-sectional view taken along the line IIIa—IIIb of FIG. 2A.
Figure 4:
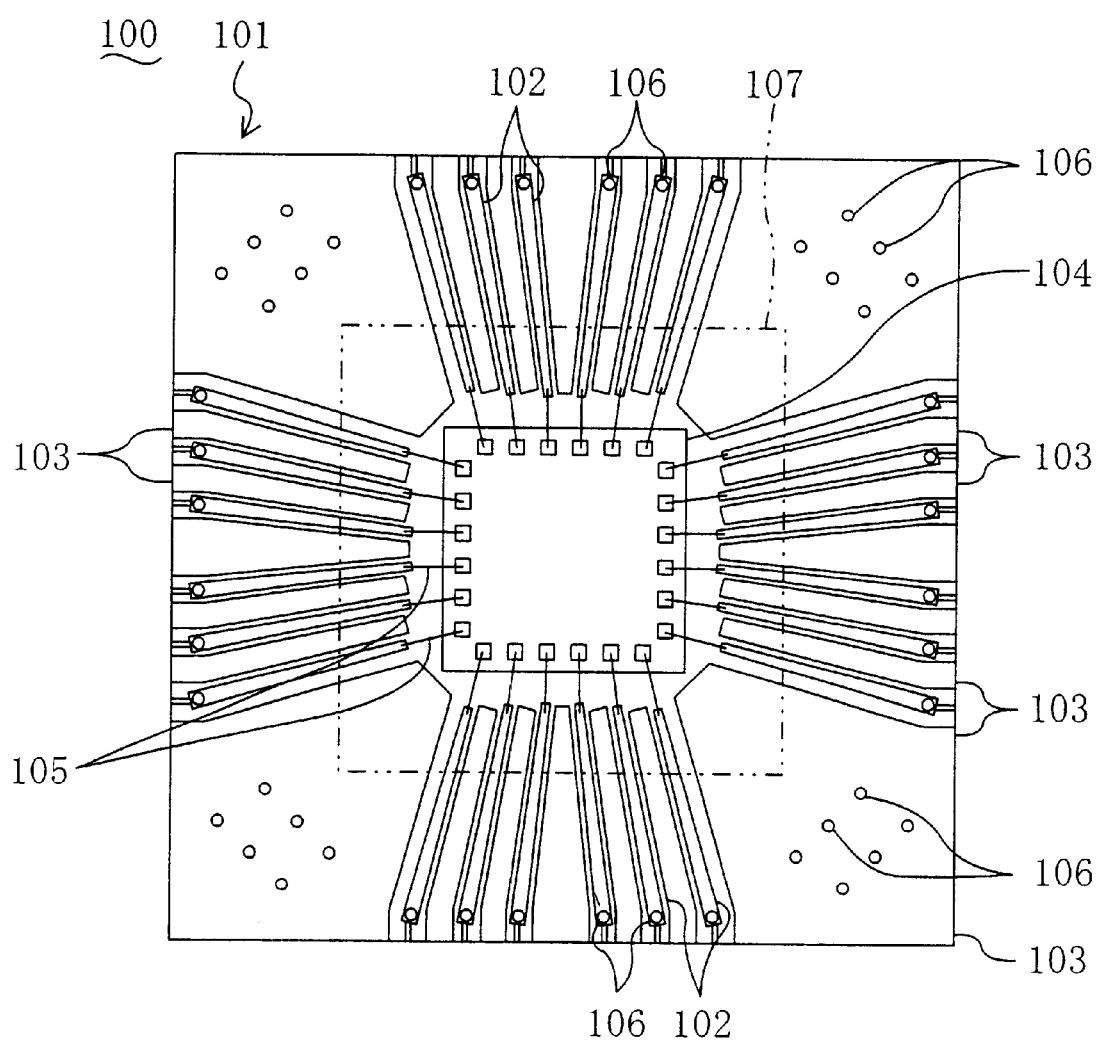
FIG. 4 is a plan view of a conventional BGA semiconductor device.

As shown in FIG. 3A which is a cross-sectional view taken along the line IIIa—IIIa of FIG. 2A and in FIG. 3B which is a cross-sectional view taken along the line IIIb—IIIb of FIG. 2A, each of the surface layer lines 12 and an internal ground layer 23 constitute a microstrip line, while each of back-surface lines 21 and the internal ground layer 23 constitute a microstrip line. Each of the microstrip lines has a specified characteristic impedance $Z_0$.

The surface layer lines 12 are electrically connected to the respective back-surface lines 21 and to ball bumps 22 through first vias 16A and the interline ground layers 13 are also electrically connected to the internal ground layer 23 through second vias 16B as potential fixing means. In the example, the open ends of the interline ground layers 13 function as open stubs using the second vias 16B as respective starting points.

The surface layer lines 12 and the interline ground layers 13 are covered with a solder resist 25 which is a mask film made of a soldering material. A mold area 17 is sealed with a mold resin material so as to contain the semiconductor chip 14, wires 15, and the respective end portions of the surface layer lines 12 and the interline ground layer 13 closer to the semiconductor chip 10.

Although the present embodiment has positioned the surface (back surface) of the semiconductor chip 14 opposite to the surface thereof formed with an element in opposing relation to the principal surface of the substrate 11 and used the wires 15 to provide electric connection between external terminals (pads) on the surface formed with the element and the surface layer lines 12, the present invention is not limited thereto. It is also possible to implement so-called flip-chip mounting which provides electric connection with the surface layer lines 12 on the substrate 11 by opposing the bumps formed on the surface of the semiconductor chip 14 formed with the element to the principal surface of the substrate 11.

Figure 2B:
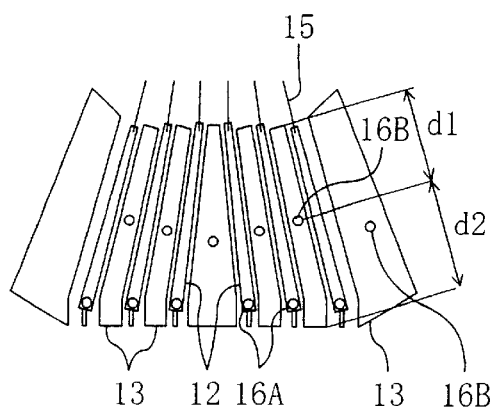
FIG. 2B is a partially enlarged cross-sectional view.

As shown in FIG. 2B which is a partially enlarged view of the interline ground layers 13 and the surface layer 12 of FIG. 2A, the present embodiment is characterized in that the second vias 16B formed in the interline ground layers 13 are provided at points at which the distances d1 and d2 from any of the open ends of the interline ground layers 13 are less than one quarter of an effective wavelength corresponding to the maximum frequency component of harmonic components contained in a timing signal serving as a trigger for signal transmission.

In the arrangement, each of the distances d1 and d2 is less than one quarter of the effective wavelength containing all the harmonic components of the timing signal. As a result, a node at which total reflection occurs is no more contained, though a reflected wave in opposite phase is produced. This positively reduces the degree to which the reflected wave from the open end of the interline ground layer 13 interferes with a signal waveform on the surface layer line 12 so that transmission distortion occurring between the surface layer lines 12 is reduced reliably.

The effective wavelength at which the open stub of the open end portion of the interline ground layer 13 for rosstalk prevention is short-circuited is represented by the following expressions (1) and (2) if the length of the open end of the interline ground layer 13 is L and the effective wavelength is $\lambda_g$:

$$L=\lambda_g/4 \quad (1)$$

$$\lambda_g=\lambda_0/\sqrt{(\epsilon_e\mu_e)} \quad (2)$$

where $\lambda_0$ is the wavelength of a signal in vacuum, $\epsilon_e$ is an effective relative permittivity, and $\mu_e$ is an effective relative permeability.

The relationship between the effective wavelength $\lambda_g$ and the frequency f of a signal is represented by the following expression (3) if the speed of light in vacuum is $c_0$:

$$f=c_0/\lambda_g \quad (3).$$

If a semiconductor integrated circuit formed in the semiconductor chip 14 is, e.g., a digital circuit, the digital circuit normally uses a clock signal as a timing signal serving as a trigger for data transmission. If the frequency of the clock signal is, e.g., 2 GHz, the wavelength of the harmonic component of the square wave is ten times that of the fundamental wave, so that the frequency band required of the clock signal is oftentimes 10 GHz or more.

If the rise time of the square wave is 50 ps (picosecond), the maximum component of the harmonic of the square wave is approximated to about 7 GHz. If a sine wave is substituted for the square wave at a frequency of 7 GHz for easier calculation and the material of the substrate 11 of the BGA semiconductor device 10 is a BT resin with a relative permittivity of, e.g., 4.6, the effective wavelength $\lambda_g$ on the microstrip line is about 20 mm and therefore one quarter wavelength thereof ($\lambda_g/4$) is about 5 mm. In this case, the relative permeability $\mu_e$ is approximately 1.

If the open end length L of the interline ground layer 13 for crosstalk prevention, i.e., the open stub length is to be less than one quarter wavelength under such conditions, it will be understood that the distances d1 and d2 between the second vias 16B as the potential fixing means and the open ends are adjusted appropriately to less than 5 mm.

Thus, in the BGA semiconductor device 10 in which the semiconductor chip 14 is mounted, signal distortion in the substrate 11 is surely suppressed by fixing the potential of each of the interline ground layers 13 for crosstalk prevention provided between the lines 12 to a specified value such as a ground potential at a point at a distance of one quarter of the effective wavelength or less from each of the open ends.

Although the ground potential is used as the specified potential for the interline ground layer 13 for crosstalk prevention, the specified potential is not limited thereto. The interline ground layer 13 may also be fixed to a positive or negative dc voltage.

Although the substrate 11 is used as a substrate for the BGA semiconductor device, the substrate for the BGA semiconductor device is not limited thereto. Any wiring board may be used provided that it can transmit an RF signal.

What is claimed is:

1. A wiring board comprising:

a substrate;

a plurality of lines provided on the substrate;

an interference-preventive conductor layer provided between the lines to have open ends and prevent a timing signal interference between the lines; and potential fixing means electrically connected to the interference-preventive conductor layer;

the potential fixing means being provided at a point at which a distance from each of the open ends of the interference-preventive conductor layer is less than one quarter of a wavelength corresponding to a maximum frequency component of harmonic components contained in the timing signal.

2. The wiring board of claim 1, wherein the substrate is composed of a multilayer structure of a plurality of wiring layers and an insulating film formed between the plurality of wiring layers and the potential fixing means is connected to at least one of the plurality of wiring layers.

3. A semiconductor device comprising:

a substrate;

a plurality of lines provided on the substrate;

a semiconductor chip held on the substrate, the semiconductor chip having a semiconductor element electrically connected to the plurality of lines;

an interference-preventive conductor layer provided between the lines to have open ends and prevent a timing signal interference between the lines; and potential fixing means electrically connected to the interference-preventive conductor layer, the potential fixing means being provided at a point at which a distance from each of the open ends of the interference-preventive conductor layer is less than one quarter of a wavelength corresponding to a maximum frequency component of harmonic components contained in the timing signal.

4. The semiconductor device of claim 3, wherein the substrate is composed of a multilayer structure of a plurality of wiring layers and an insulating film formed between the plurality of wiring layers and the potential fixing means is a via connected to at least one of the plurality of wiring layers.

* * * * *